United States Patent
Cyr et al.

(10) Patent No.: US 9,897,444 B2
(45) Date of Patent: Feb. 20, 2018

(54) MEASUREMENTS OF AN INTEGRATED CIRCUIT CHIP AND CONNECTED CHIP CARRIER TO ESTIMATE HEIGHT OF INTERCONNECT

(71) Applicant: INTERNATIONAL BUSINESS MACHINES CORPORATION, Armonk, NY (US)

(72) Inventors: Elaine Cyr, Granby (CA); Dominique L. Demers, Waterloo (CA); Paul F. Fortier, Richelieu (CA); Alexander Janta-Polczynski, Shefford (CA)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 502 days.

(21) Appl. No.: 14/580,370

(22) Filed: Dec. 23, 2014

(65) Prior Publication Data
US 2016/0178363 A1 Jun. 23, 2016

(51) Int. Cl.
*G01B 5/18* (2006.01)
*G01B 21/16* (2006.01)
(Continued)

(52) U.S. Cl.
CPC .......... *G01B 21/16* (2013.01); *G01B 11/0608* (2013.01); *G01B 11/14* (2013.01);
(Continued)

(58) Field of Classification Search
CPC .... G01B 21/16; G01B 11/0608; G01B 11/14; H01L 24/17
(Continued)

(56) References Cited

U.S. PATENT DOCUMENTS 4,168,437 A * 9/1979 Nihonmatsu .......... G01B 11/00
250/559.2
6,177,682 B1 1/2001 Bartulovic et al.
(Continued)

FOREIGN PATENT DOCUMENTS

CN 102032872 7/2012

OTHER PUBLICATIONS

Lei Su et al."Defect Inspection of Flip Chip Solder Bumps Using an Ultrasonic Transducer"., www.mdpi.com/journal/sensors,Published: Nov. 27, 2013, 11 pages.

*Primary Examiner* — Toan Le
*Assistant Examiner* — Xiuquin Sun
(74) *Attorney, Agent, or Firm* — Steven Meyers; Andrew M. Calderon; Roberts Mlotkowski Safran Cole & Calderon, P.C.

(57) ABSTRACT

Systems and methods are provided for obtaining measurements of an integrated circuit chip and a connected carrier to obtain the measurements of the interconnect heights. More specifically, a method is provided that includes defining a top best fit reference plane and a bottom best fit reference plane, and adjusting the top best fit reference and the bottom best fit reference to be superposed to one another. The method further includes calculating first distances between each height measurement for a first set of points and the adjusted top best fit reference plane, and calculating second distances between each height measurement for a second set of points and the adjusted bottom best fit reference plane. The method further includes calculating height values of a gap or interconnect between the first substrate and the second substrate by subtracting the thickness of the first substrate and the second distances from the first distances.

20 Claims, 11 Drawing Sheets

(51) Int. Cl.
  *H01L 23/00*  (2006.01)
  *G01B 11/06*  (2006.01)
  *G01B 11/14*  (2006.01)

(52) U.S. Cl.
  CPC .......... *H01L 24/17* (2013.01); *G01B 2210/56* (2013.01); *H01L 2924/384* (2013.01)

(58) Field of Classification Search
  USPC ........................................................ 702/166
  See application file for complete search history.

(56) References Cited

U.S. PATENT DOCUMENTS

| | | | |
|---|---|---|---|
| 2007/0229791 A1* | 10/2007 | Inoue | G01B 11/0608 355/67 |
| 2012/0194792 A1* | 8/2012 | Sapp | G03F 7/70066 355/55 |
| 2013/0033286 A1 | 2/2013 | Huang et al. | |
| 2014/0104411 A1 | 4/2014 | Ryu et al. | |

\* cited by examiner

| Integrated circuit chip assembly | AVG | MAX | MIN | DELTA | RMS | C1 |
|---|---|---|---|---|---|---|
| c4 height 21(4-7) | 47.3 | 54.6 | 38.6 | 16 | 47.3 | |
| c4 height 22(4-5) | 49.6 | 53.8 | 42 | 11.8 | 49.6 | |
| c4 height 33(4-25) | 49.9 | 56.4 | 34 | 22.5 | 50 | Bridge |
| c4 height 40(4-8) | 48 | 53 | 36 | 17.1 | 48 | |

US 9,897,444 B2

MEASUREMENTS OF AN INTEGRATED CIRCUIT CHIP AND CONNECTED CHIP CARRIER TO ESTIMATE HEIGHT OF INTERCONNECT

FIELD OF THE INVENTION

The invention relates to semiconductor device fabrication, and more particularly, to systems and methods for obtaining measurements of an integrated circuit chip and a connected carrier to attain an improved estimate for a height of interconnect under the integrated circuit chip area.

BACKGROUND

Flip chip, also known as controlled collapse chip connection (C4), is a method for interconnecting semiconductor devices, such as integrated circuit (IC) chips and microelectromechanical systems (MEMS), to chip carriers and external circuitry with join structures, such as C4 bumps (solder bumps), that have been deposited onto chip pads. The solder bumps are deposited on the chip pads on the top side of the wafer during the final wafer processing step. In order to mount the chip to chip carriers and external circuitry (e.g., a circuit board or another chip or wafer), the chip is flipped over so that a top side of the chip faces down, and is then aligned so that the pads align with matching pads on the chip carriers or external circuitry. Thereafter, the solder is flowed to complete the C4 interconnect.

Height values of the C4 interconnect (e.g., thicknesses of the gap between the integrated circuit chip and the chip carriers or external circuitry) are helpful data during integrated circuit chip packaging processes development and qualification. In instances where the integrated circuit chip is connected to the chip carriers or external circuitry via C4 bumps, height values of the C4 bumps are at least one component that is determinative of the height values of the interconnect between the integrated circuit chip and the chip carriers or external circuitry. Consequently, the height values of the C4 bumps and uniformity/variability of the C4 bumps provide information to evaluate cleanability under the integrate circuit chip, underfill flowability, chip join yields, and also may give insight of the shapes of the C4 bumps (e.g., dumbbell shape or oval shape) affecting reliability of the C4.

Conventionally, in order to obtain information on the height values of the C4 bumps, one or more cross-sections are taken of the C4 interconnect between the integrated circuit chip and the chip carriers or external circuitry. This method provides a height value of the C4 interconnect at the location of the cross-section, the shape of the C4 bumps at the location of the cross-section, and a few additional visual details at the location of the cross-section. However, each cross section can take hours of work to obtain, and the sample size is limited, e.g., each cross section only provides a snap shot of one location between the integrated circuit chip and the chip carriers or external circuitry. Additionally, the process is destructive to the measured interconnect device, and thus the measured interconnect device cannot be used downstream to evaluate the impact of the height of the C4 interconnect on downstream operations.

SUMMARY

In a first aspect of the invention, a method is provided for calculating height values of a gap or interconnect between a first substrate and a second substrate of an integrated circuit chip assembly using a measuring system. The method includes defining a top best fit reference plane from measurement heights of a plurality of top reference points on a top surface of the second substrate. The method further includes defining a bottom best fit reference plane from measurement heights of a plurality of bottom reference points on a bottom surface of the second substrate. The method further includes adjusting data from the top best fit reference plane and data from the bottom best fit reference plane such that the top best fit reference plane and the bottom best fit reference plane are superposed to one another. The method further includes calculating first distances between each measurement height of a first set of points on an external surface of the first substrate and the adjusted top best fit reference plane. The method further includes calculating second distances between each measurement height of a second set of points on the bottom surface of the second substrate and the adjusted bottom best fit reference plane. The method further includes calculating the height values of the gap or interconnect between the first substrate and the second substrate by subtracting a thickness of the first substrate and the second distances from the first distances for each set of corresponding points of the first set of points and the second set of points using a computing device.

In a second aspect of the invention, a method is provided for manufacturing an integrated circuit chip assembly. The method includes obtaining measurement heights of a plurality of top reference points on a top surface of the second substrate using an x,y, z coordinate measuring system at predetermined locations. The method further includes defining a top best fit reference plane from the measurement heights of the plurality of top reference points on the top surface of the second substrate. The method further includes obtaining measurement heights of a plurality of bottom reference points on a bottom surface of the second substrate using the x,y, z coordinate measuring system at predetermined locations. The method further includes defining a bottom best fit reference plane from the measurement heights of the plurality of bottom reference points on the bottom surface of the second substrate. The method further includes adjusting data from the top best fit reference plane and data from the bottom best fit reference plane such that the top best fit reference plane and the bottom best fit reference plane are superposed to one another. The method further includes obtaining measurement heights of a first set of points on an external surface of the first substrate using the x,y, z coordinate measuring system in relation to the data from the top best fit reference plane. The method further includes calculating first distances between each measurement height of the first set of points on the external surface of the first substrate and the adjusted top best fit reference plane. The method further includes obtaining measurement heights of a second set of points on the bottom surface of the second substrate using the x,y, z coordinate measuring system in relation to the data from the bottom best fit reference plane. The method further includes calculating second distances between each measurement height of the second set of points on the bottom surface of the second substrate and the adjusted bottom best fit reference plane. The method further includes calculating the height values of the gap or interconnect between the first substrate and the second substrate by subtracting a thickness of the first substrate and the second distances from the first distances for each set of corresponding points of the first set of points and the second set of points using a computing device. The method further includes modeling heights of the gap or interconnect in a three dimensional graph using the calculated height values and a computing device.

In a third aspect of the invention, a computer program product is provided for calculating height values of a gap or interconnect between a first substrate and a second substrate of an integrated circuit chip assembly. The computer program product includes a computer readable storage medium having program instructions embodied therewith. The computer readable storage medium is not a transitory signal per se, and the program instructions are readable by a computing device to cause the computing device to perform a method that includes defining a top best fit reference plane that is an approximation of measurements of heights of a plurality of top reference points on a top surface of the second substrate. The method further includes defining a bottom best fit reference plane that is an approximation of measurements of heights of a plurality of bottom reference points on a bottom surface of the second substrate. The method further includes adjusting the top best fit reference plane and the bottom best fit reference plane to be parallel to one another. The method further includes calculating first distances between each height measurement for a first set of points and the adjusted top best fit reference plane. The method further includes calculating second distances between each height measurement for a second set of points and the adjusted bottom best fit reference plane. The method further includes calculating height values of a gap or interconnect between the first substrate and the second substrate by subtracting the thickness of the first substrate and the second distances from the first distances for each of the corresponding points of the first set of points and the second set of points.

BRIEF DESCRIPTION OF THE SEVERAL VIEWS OF THE DRAWINGS

The present invention is described in the detailed description, which follows, in reference to the noted plurality of drawings by way of non-limiting examples of exemplary embodiments of the present invention.

DETAILED DESCRIPTION

Figure 1:
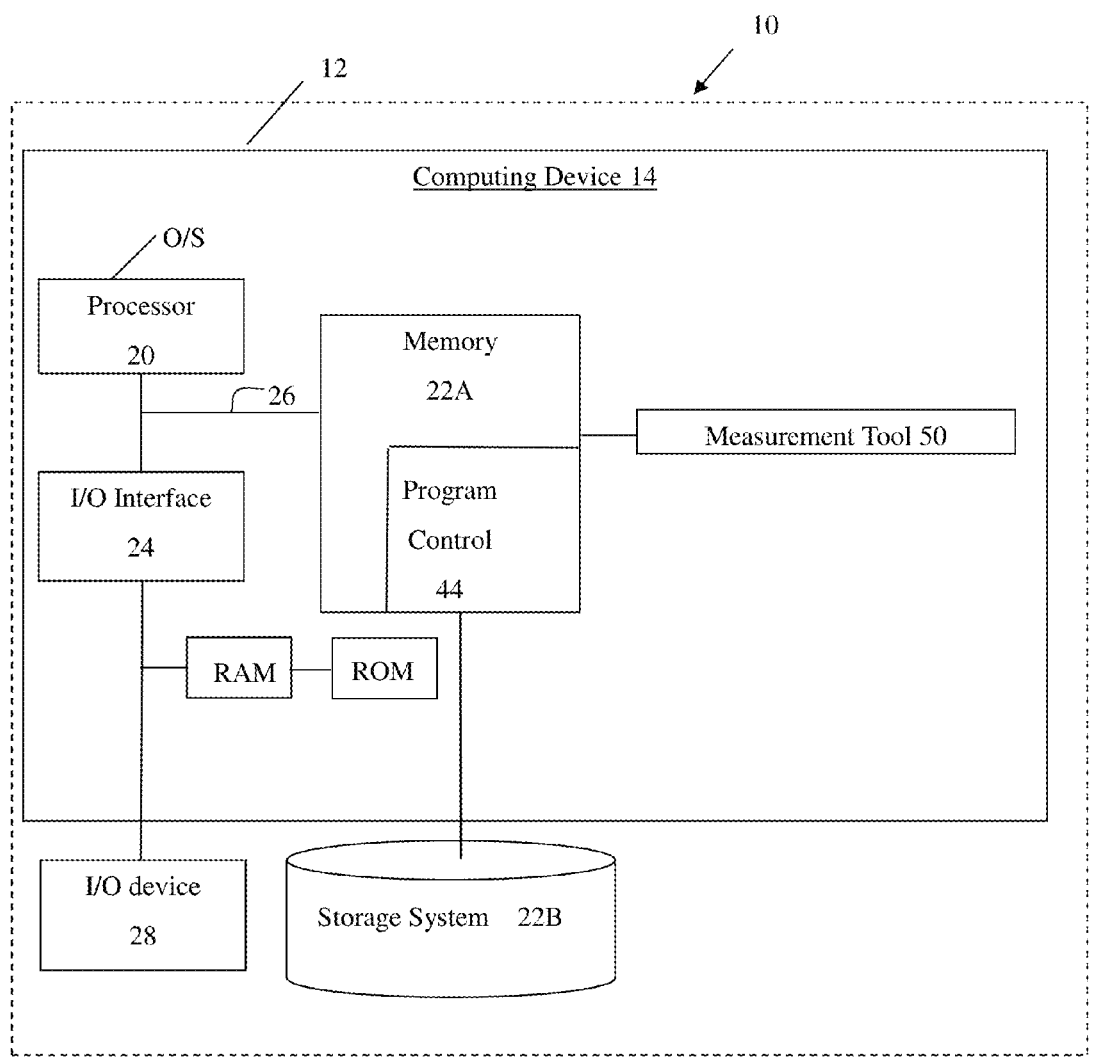
FIG. 1 shows an illustrative external environment for implementing the invention in accordance with aspects of the invention.

The invention relates to semiconductor device fabrication, and more particularly, to systems and methods for obtaining measurements of an integrated circuit chip and a connected carrier to attain an improved estimate for a height of interconnect under the integrated circuit chip area. More specifically, the present invention provides systems and methods of calculating height values of a gap or interconnect between a first substrate and a second substrate of an integrated circuit chip assembly. For example, aspects of the present invention include defining top and bottom reference planes in order to apply a differential to calculate the height values of the gap or interconnect between the first substrate and the second substrate.

Advantageously, these approaches substantially improve the estimation of the height values of the gap or interconnect between the first substrate and the second substrate in every coordinate in a short period of time without destroying the integrated circuit chip assembly. More advantageously, the integrated circuit chip assembly may be used in downstream processes, and it is possible to evaluate how the height values of the gap or interconnect impact downstream processes. Additionally, the systems and methods of the present invention provide an adequate amount of data for statistical evaluation of the assembly process and the influence of the incoming components specifications on the assembly process. Furthermore, due to the high quantity of parts analyzed, nonconforming parts can be easily identified for future analysis to improve the assembly process.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

FIG. 1 shows an illustrative environment 10 for managing the processes in accordance with the invention. To this extent, environment 10 includes a server 12 or other computing system that can perform the processes described herein. In particular, server 12 includes a computing device 14. The computing device 14 can be resident on a network infrastructure or computing device of a third party service provider (any of which is generally represented in FIG. 1).

The computing device 14 also includes a processor 20 (e.g., CPU), memory 22A, an I/O interface 24, and a bus 26. The memory 22A can include local memory employed during actual execution of program code, bulk storage, and cache memories which provide temporary storage of at least some program code in order to reduce the number of times code must be retrieved from bulk storage during execution. In addition, the computing device includes random access memory (RAM), a read-only memory (ROM), and an operating system (O/S).

The computing device 14 is in communication with external I/O device/resource 28 and storage system 22B. For example, I/O device 28 can comprise any device that enables an individual to interact with computing device 14 (e.g., graphic user interface) or any device that enables computing device 14 to communicate with one or more other computing devices using any type of communications link. The external I/O device/resource 28 may be for example, a handheld device, PDA, handset, keyboard etc.

In general, processor 20 executes computer program code (e.g., program control 44), which can be stored in memory 22A and/or storage system 22B. Moreover, in accordance with aspects of the invention, program control 44 controls a measurement tool 50 (e.g., at least a portion of an electronic design automation (EDA) tool), which performs processes described herein. The measurement tool 50 can be implemented as one or more program code in program control 44 stored in memory 22A as separate or combined modules. Additionally, the measurement tool 50 may be implemented as separate dedicated processors or a single or several processors to provide the function of the measurement tool 50. While executing the computer program code, the processor 20 can read and/or write data to/from memory 22A, storage system 22B, and/or I/O interface 24. The program code executes the processes of the invention. The bus 26 provides a communications link between each of the components in computing device 14.

By way of example, in embodiments, the measurement tool 50 may be configured to define a top best fit reference plane and a bottom best fit reference plane. The measurement tool 50 may be further configured to adjust the top best fit reference plane and the bottom best fit reference plane to be parallel to one another. The measurement tool 50 may be further configured to calculate first distances between each height measurement for a first set of points and the adjusted top best fit reference plane, and calculate second distances between each height measurement for a second set of points and the adjusted bottom best fit reference plane. The measurement tool 50 may be further configured to calculate height values of a gap or interconnect between the first substrate and the second substrate by subtracting the first distances from the second distances.

The computing device 14 can comprise any general purpose computing article of manufacture capable of executing computer program code installed thereon (e.g., a personal computer, a mobile device, a server, etc.). However, it is understood that computing device 14 is only representative of various possible equivalent-computing devices that may perform the processes described herein. To this extent, in embodiments, the functionality provided by computing device 14 can be implemented by a computing article of manufacture that includes any combination of general and/or specific purpose hardware and/or computer program code. In each embodiment, the program code and hardware can be created using standard programming and engineering techniques, respectively.

Similarly, server 12 is only illustrative of various types of computer infrastructures for implementing the invention. For example, in embodiments, server 12 comprises two or more computing devices (e.g., a server cluster) that communicate over any type of communications link, such as a network, a shared memory, or the like, to perform the process described herein. Further, while performing the processes described herein, one or more computing devices on server 12 can communicate with one or more other computing devices external to server 12 using any type of communications link. The communications link can comprise any combination of wired and/or wireless links; any combination of one or more types of networks (e.g., the Internet, a wide area network, a local area network, a virtual private network, etc.); and/or utilize any combination of transmission techniques and protocols.

Figure 2:
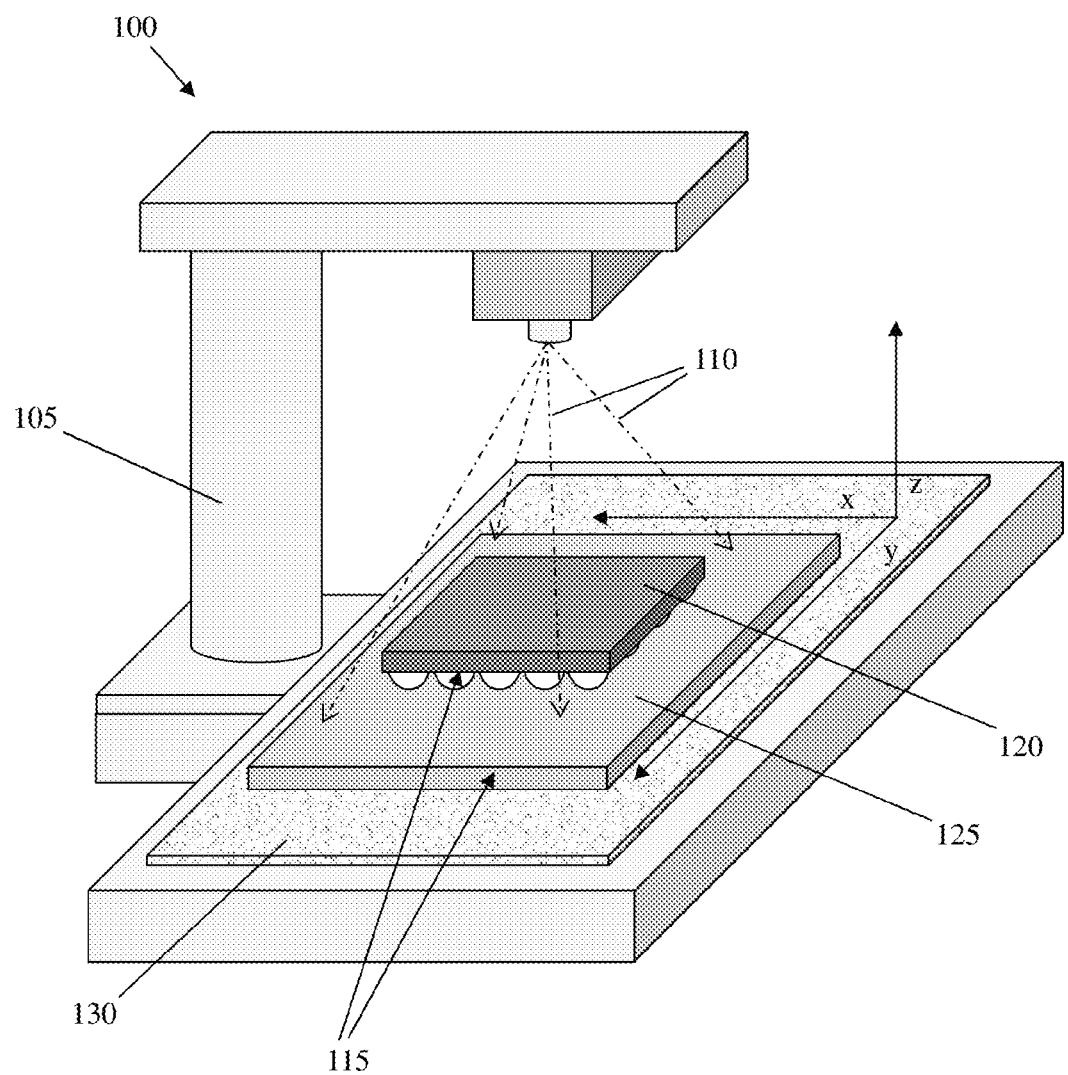
FIG. 2 shows a diagram of an embodiment of an apparatus for implementing an inspection technique in accordance with aspects of the invention.

FIG. 2 is a diagram of an embodiment of an apparatus for implementing an inspection and measurement technique in accordance with aspects of the present invention. It should be noted that the apparatus depicted herein is merely exemplary of one method of implementing the present invention and as such should not be construed as limiting. An inspection system 100 includes an x, y, z coordinate measuring system 105 for activating laser beams 110 onto one or more surfaces of an integrated circuit chip assembly 115 to be inspected and for receiving signals representative of the reflected laser beams for deriving various dimensional characteristics of a first substrate 120 (e.g., an integrated circuit chip) mounted on a second substrate 125 (e.g., a laminate of a chip carrier).

The inspection system 100 may also include a staging unit 130 that may, for example, include a motion mechanism (not shown) for positioning the integrated circuit assembly 115 at different x-y-z positions below a portion of the x, y, z coordinate measuring system 105. The staging unit 130 may be controlled by a computing device (e.g., computing device 14 as shown and discussed in FIG. 1) for executing various instructions necessary to perform the inspection of an electronic component. Through manipulation of staging unit 130, the integrated circuit chip assembly 115 may be positioned such that the various desired dimensions can be obtained. The staging unit 130 may also be manipulated to facilitate inspection of one-dimensional, two-dimensional, and three-dimensional profiles as desired. In embodiments, measurement data collected by the x, y, z coordinate measuring system 105 is transmitted to the computing device (e.g., computing device 14 as shown and discussed in FIG. 1) for analysis and reporting.

In embodiments, the inspection system 100 uses pattern recognition and a machine vision system in order to find reference aspects or fiducials (e.g., objects placed in the field of view of the inspection system that appear in an image produced for use as a point of reference or a measure) on the substrates and define an x, y, z coordinate system that may be used to place the the integrated circuit chip assembly 115 in a specific axis. The defined x, y, z, coordinate system and specified axis allow the inspection system 100 to perform multiple measurements for multiple sets of data points and the references at precise requested locations.

Figure 3A:
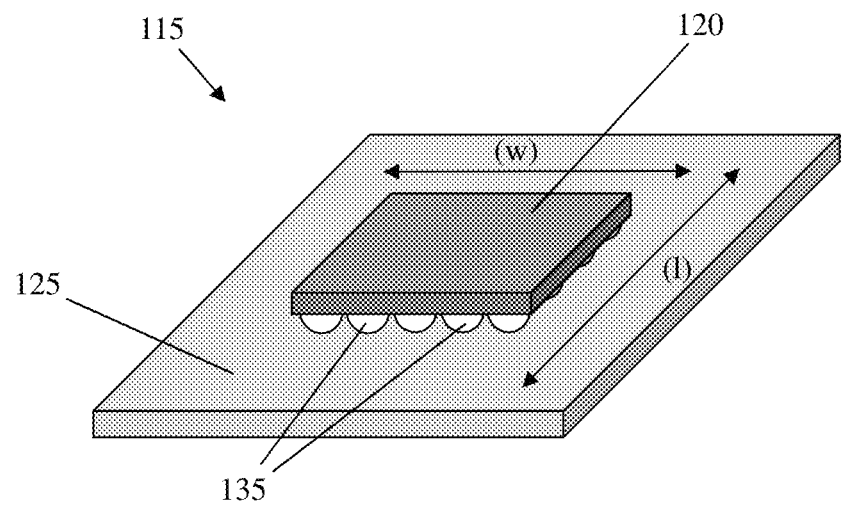
FIGS. 3A and 3B show perspective and cross-sectional views, respectively, of an integrated circuit chip assembly in accordance with aspects of the invention.
Figure 3B:
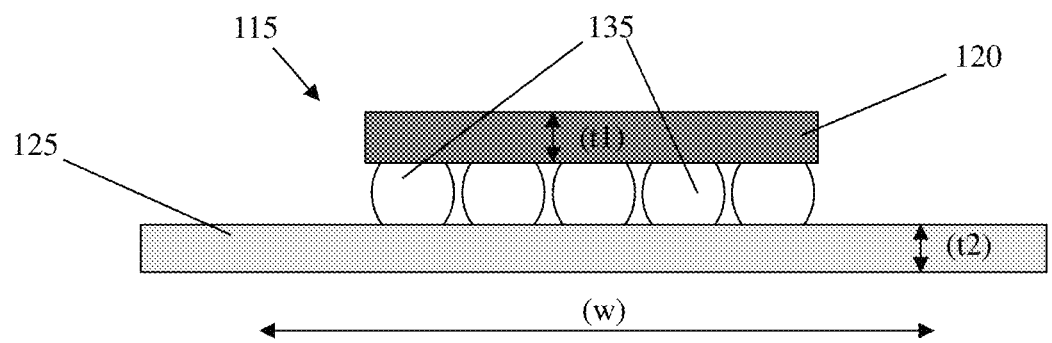

FIGS. 3A and 3B show perspective and cross-sectional views, respectively, of the integrated circuit chip assembly 115 that may be inspected using the inspection system 100 (as described with respect to FIG. 2) in accordance with aspects of the present invention. In embodiments, the integrated circuit chip assembly 115 may comprise a first substrate 120 (e.g., an integrated circuit chip) that is smaller in width (w) and length (l) than a second substrate 125 (e.g., a laminate of a chip carrier). Additionally, the first substrate 120 and the second substrate 125 have substantially known thicknesses (t1) and (t2), respectively. The thickness of (t1) or (t2) may or may not be constant, as long the thickness is known at each point of the measurement set. Also, in accordance with aspects of the present invention, the first substrate 120 is connected to the second substrate 125, for example, via a C4 connection 135.

Figures 4A, 4B:
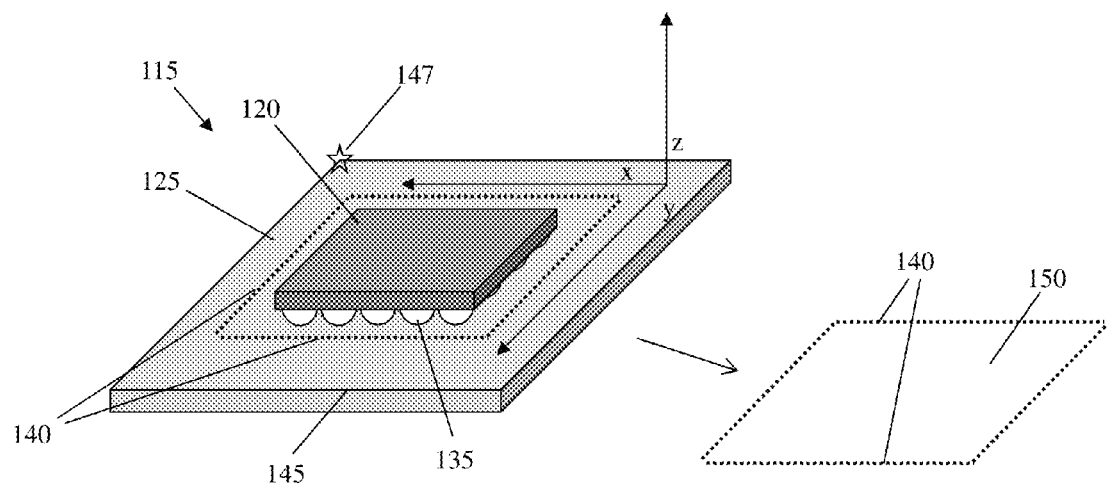
FIGS. 4A, 4B, 5A, 5B, 6A, 6B, 7A, 7B, 8, 9, and 10 show visual representations of examples of operation in accordance with aspects of the invention.

FIG. 4A illustrates functionality of the x, y, z coordinate measuring system 105 (as described with respect to FIG. 2) to obtain measurements of the integrated circuit chip assembly 115 in accordance with aspects of the present invention. For example, the x, y, z coordinate measuring system 105 may be configured to obtain measurements of heights of a plurality of top reference points 140 on a top surface 145 of the second substrate 125 (identified by corner locator 147, which is not actually on the substrate, but added to the figures for an easier understanding of orientation of the substrates). In embodiments, the top reference points 140 should be measured on a top surface 145 of the second substrate 125 that is not covered by the first substrate 120 and/or the C4 connection 135. Additionally, the top reference points 140 should be localized around a periphery of the first substrate 120.

FIG. 4B illustrates functionality of the computing device (e.g., computing device 14 and measurement tool 50 as described with respect to FIG. 1) to define a top best fit reference plane 150 in accordance with aspects of the present invention. For example, the computing device may be configured to utilize the heights of the top reference points 140 in a least square fit plane method to define a top best fit reference plane 150 that is an approximation of the set of the heights of the top reference points 140. It should be understood to those of ordinary skill in the art that the greater the number of the top reference points 140 and the closer the top reference points 140 are localized around the periphery of the first substrate 120, the better the approximation of the top best fit reference plane 150 covered by the first substrate 120 and/or the C4 connection 135.

Figures 5A, 5B:
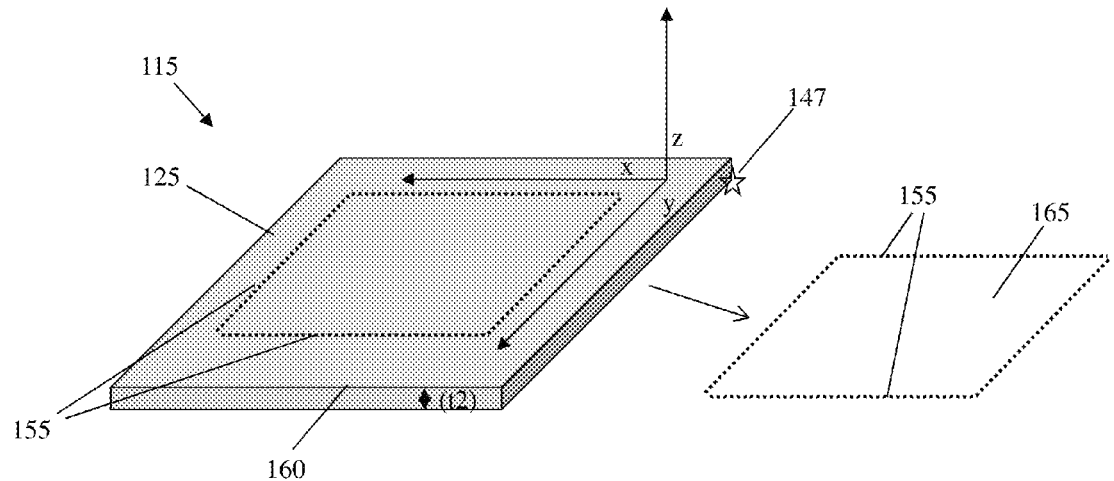

FIG. 5A illustrates additional functionality of the x, y, z coordinate measuring system 105 (as described with respect to FIG. 2) to obtain measurements of the integrated circuit chip assembly 115 in accordance with aspects of the present invention. For example, the x, y, z coordinate measuring system 105 may be configured to obtain measurements of heights of a plurality of bottom reference points 155 on a bottom surface 160 of the second substrate 125. In embodiments, the height of the plurality of bottom reference points 155 may be obtained with the integrated circuit chip assembly 115 flipped upside down. The height of the plurality of bottom reference points 155 should be obtained using the same x and y coordinates used to obtain the height of the plurality of top reference points 140 (as described with respect to FIG. 4A) such that the bottom reference points 155 are similarly localized around the periphery of the first substrate 120 (not shown). The thickness (t2) of the substrate 125 should be defined at each predetermined location of the top reference points 140 and the bottom reference points 155.

FIG. 5B illustrates functionality of the computing device (e.g., computing device 14 and measurement tool 50 as described with respect to FIG. 1) to define a bottom best fit reference plane 165 in accordance with aspects of the present invention. For example, the computing device may be configured to utilize the heights of the bottom reference points 155 in a least square fit plane method to define a bottom best fit reference plane 165 that is an approximation of the set of the heights of the bottom reference points 155. It should be understood to those of ordinary skill in the art that the greater the number of the bottom reference points 155 and the closer bottom reference points 155 are localized around the periphery of the first substrate 120, the better the approximation of the bottom best fit reference plane 165 covered by the first substrate 120 and/or the C4 connection 135 (shown in FIG. 4A).

Figures 6A, 6B:
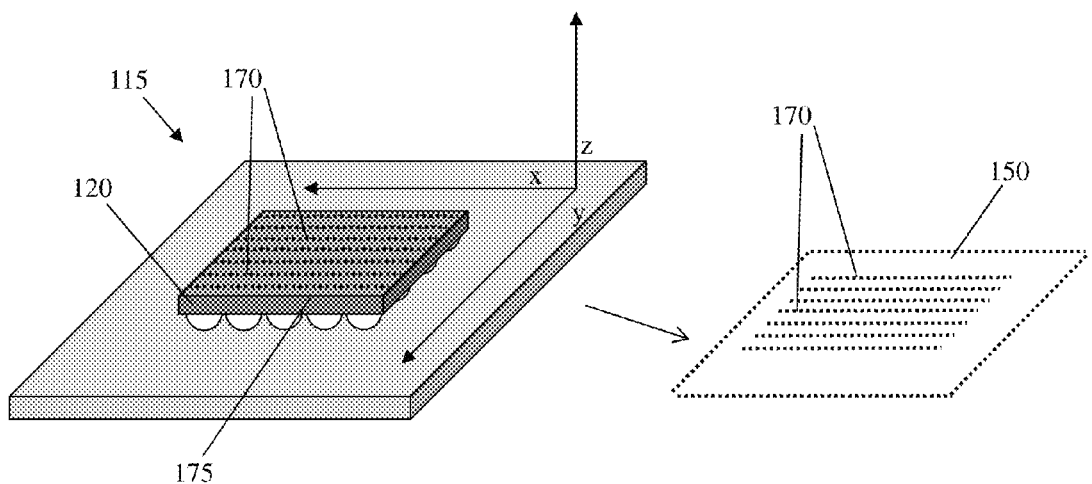

FIG. 6A illustrates additional functionality of the x, y, z coordinate measuring system 105 (as described with respect to FIG. 2) to obtain measurements of the integrated circuit chip assembly 115 in accordance with aspects of the present invention. For example, the x,y, z coordinate measuring system 105 may be further configured to obtain measurements of heights of a plurality of points 170 on an external surface 175 of the first substrate 120. In embodiments, the external surface 175 may be a top surface of the first substrate 120. As shown in FIG. 6B, the heights of the plurality of points 170 can be linked relatively to the top best fit reference plane 150 defined from the plurality of top reference points 140 (as described with respect to FIGS. 4A and 4B).

Figures 7A, 7B:
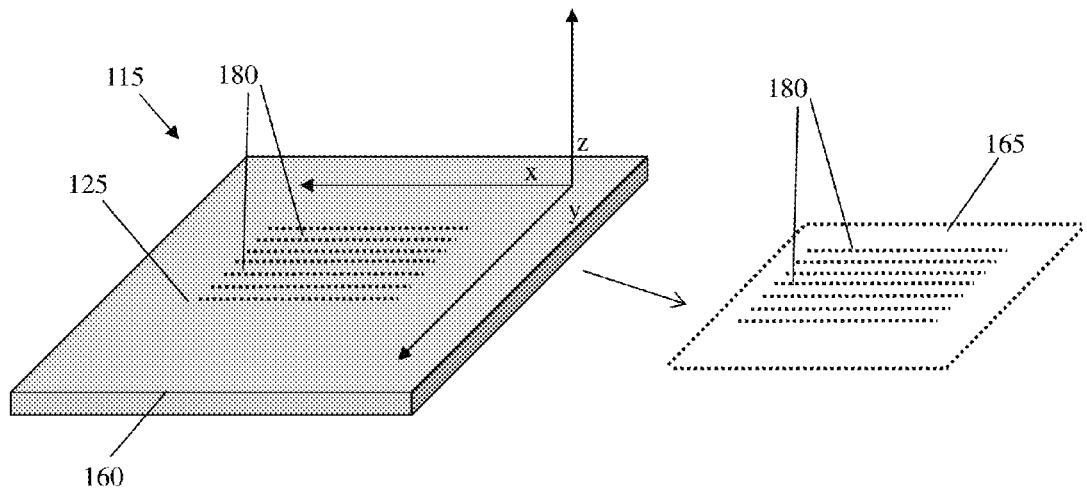

FIG. 7A illustrates additional functionality of the x, y, z coordinate measuring system 105 (as described with respect to FIG. 2) to obtain measurements of the integrated circuit chip assembly 115 in accordance with aspects of the present invention. For example, the x,y, z coordinate measuring system 105 may be further configured to obtain measurements of heights of a plurality of points 180 on the bottom surface 160 of the second substrate 125 in an area that corresponds to the position of the first substrate 120 (shown in FIG. 6A). In embodiments, the height of a plurality of points 180 may be obtained with the integrated circuit chip assembly 115 flipped upside down. The height of the plurality of points 180 should be obtained using the same x and y coordinates used to obtain the height of the plurality of points 170 (as described with respect to FIG. 6A) such that the heights of the plurality of points 180 are obtained in an area that correspond to the position of the first substrate 120 (shown in FIG. 6A). As shown in FIG. 7B, the heights of the plurality of points 180 can be linked relatively to the bottom best fit reference plane 165 defined from the plurality of top reference points 155 (as described with respect to FIGS. 5A and 5B).

Figure 8:
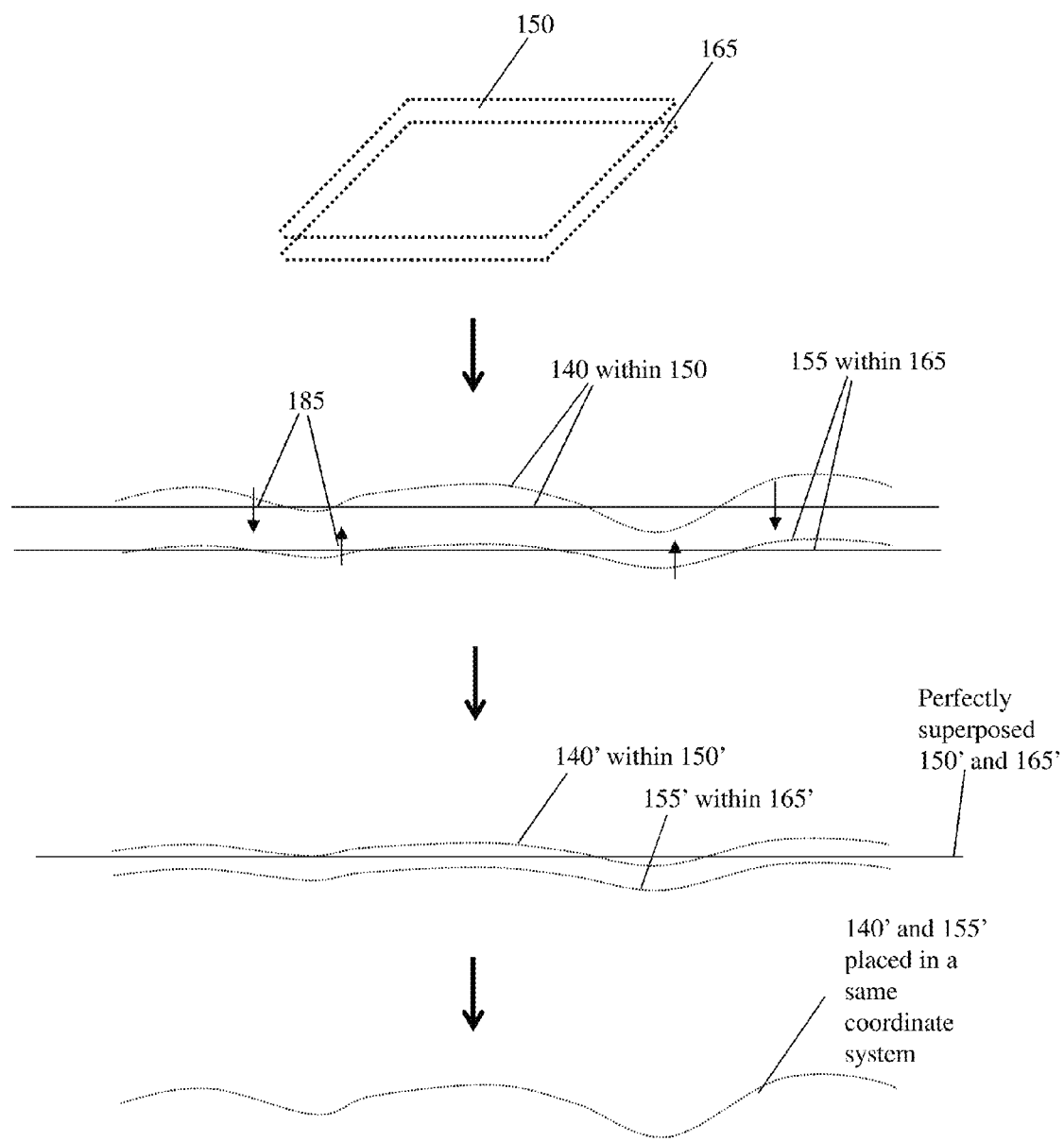

FIG. 8 shows perspective and cross-sectional views, respectively, of the top best fit reference plane 150 and the bottom best fit reference plane 165 (as described with respect to FIGS. 4A, 4B, 5A, and 5B), which illustrate functionality of the computing device (e.g., computing device 14 and measurement tool 50 as described with respect to FIG. 1) to adjust the top best fit reference plane 150 and the bottom best fit reference plane 165 in accordance with aspects of the present invention. For example, the computing device may be configured to adjust the top best fit reference plane 150 and the bottom best fit reference plane 165 to make them parallel to one another in a same space (e.g., perfectly superimposed). As should be understood, the top best fit reference plane 150 and the bottom best fit reference plane 165 are used as an initial alignment and seed for the system to find a perfect superposition of the plurality of top reference points 140 and the plurality of bottom reference points 155.

In embodiments, the adjustment of the parallelism of the top best fit reference plane 150 and the bottom best fit reference plane 165 includes executing program instructions to perform a mathematical transformation (e.g., a three-dimensional affine transformation using a transformation matrix) to superpose precisely the shapes defined by the plurality of top reference points 140 and the plurality of bottom reference points 155 into exactly superposed data. The mathematical transformation may include comparing the shapes defined by the plurality of top reference points 140 and the plurality of bottom reference points 155 and adjusting the heights and angles (represented as arrows 185 in FIG. 8) of the plurality of top reference points 140 and the plurality of bottom reference points 155 prior to defining an adjusted top best fit reference plane 150' and an adjusted bottom best fit reference plane 165' that are exactly parallel superposed planes. Thereafter the adjusted plurality of top reference points 140' and the adjusted plurality of bottom reference points 155' may be placed into a same coordinate system referred respectively by their reference points, which results in a parallel coordinate system defined by the adjusted top best fit reference plane 150' and the adjusted bottom best fit reference plane 165'. Consequently, this mathematical transformation (150→150' and 165→165') can thereafter also be applied to the first and second set of points 170 and 180 since they are linked to the initial top best fit reference plane 150 and bottom bets fit reference plane 165.

Figure 9:
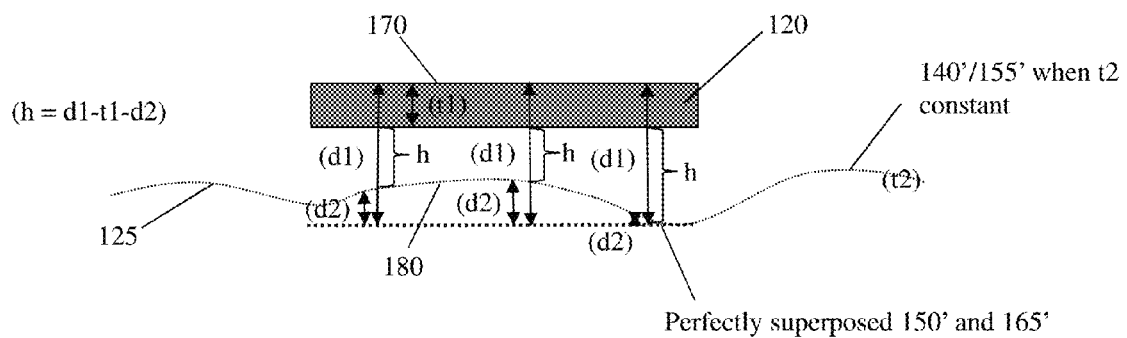

FIG. 9 illustrates additional functionality of the computing device (e.g., computing device 14 and measurement tool 50 as described with respect to FIG. 1) to calculate heights values (h) for the gap or interconnect between the first substrate 120 and the second substrate 125 in accordance with aspects of the present invention. For example, the computing device may be further configured to calculate a first distance (d1) between each of the heights of the plurality of points 170 and the adjusted top best fit reference plane 150'. Further, the computing device may be configured to calculate a second distance (d2) between each of the heights of the plurality of points 180 and the adjusted bottom best fit reference plane 165'. Thereafter, the computing device may be further configured to subtract the thickness (t1) of the first substrate and the second distance (d2) from the first distance (d1) for each of the corresponding reference points to calculate the heights values (h) for the gap or interconnect between the first substrate 120 and the second substrate 125.

Figure 10:
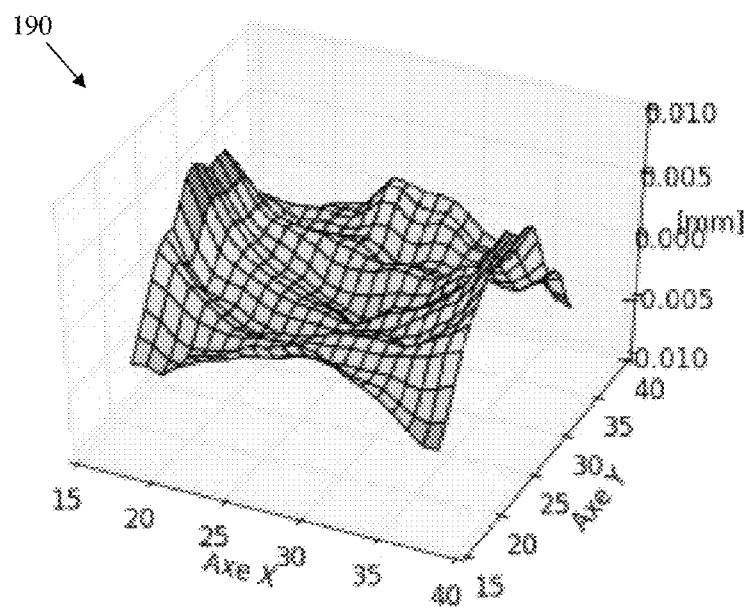

FIG. 10 illustrates additional functionality of the computing device (e.g., computing device 14 and measurement tool 50 as described with respect to FIG. 1) to model the gap or interconnect height between the first substrate 120 and the second substrate 125 in accordance with aspects of the present invention. For example, the computing device may be further configured to plot each of the calculated heights values (h) for the gap or interconnect in a three dimensional graph 190 to visually illustrate the height of the gap or interconnect between the first substrate 120 and the second substrate 125. In embodiments, the three dimensional graph 190 may be used to quickly inspect the integrated circuit chip assembly for abnormalities, as discussed in detail with respect to FIGS. 13 and 14.

Figure 11:
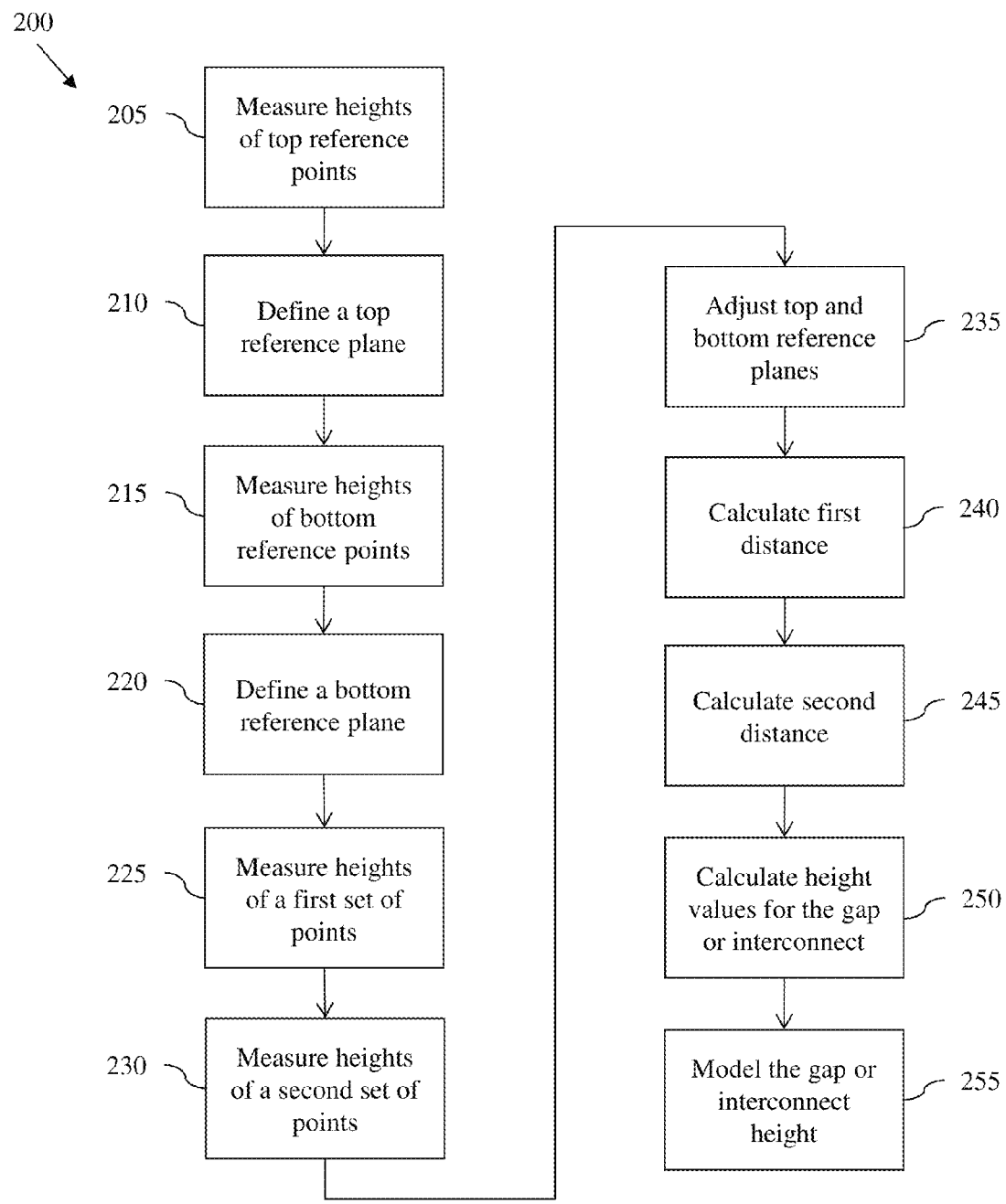
FIG. 11 shows an exemplary flow in accordance with aspects of the invention.
Figure 14:
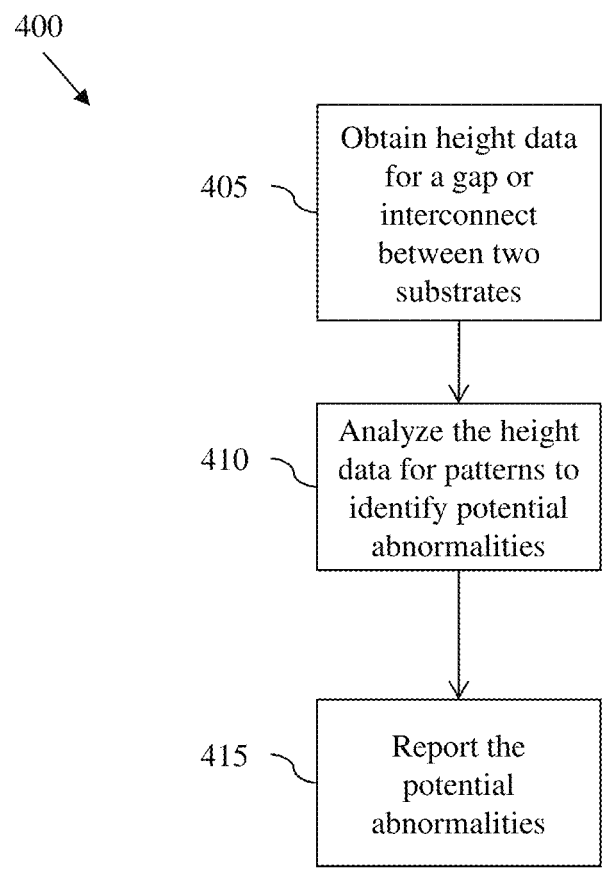
FIG. 14 shows an exemplary flow in accordance with aspects of the invention.

FIGS. 11 and 14 show exemplary flows for performing aspects of the present invention. The steps of FIGS. 11 and 14 may be implemented in the environment of FIG. 1, for example. As noted above, the flowchart(s) illustrate the architecture, functionality, and operation of possible implementations of systems, methods, and computer program products as already described herein in accordance with the various embodiments of the present invention. The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

FIG. 11 is a flow diagram illustrating a non-destructive process 200 for estimating height values for a gap between a first and second substrate of an integrated circuit chip assembly in accordance with aspects of the present invention. At step 205, measurements of heights of a plurality of top reference points are obtained from a top surface of the second substrate (see, e.g., FIG. 4A). In embodiments, the top reference points should be measured on a top surface of the second substrate that is not covered by the first substrate and/or the C4 connection. Additionally, the top reference points should be localized around a periphery of the first substrate (e.g., obtain using a base reference point on an edge of the second substrate).

At step 210, the heights of the plurality of top reference points are used to define a top best fit reference plane (see, e.g., FIG. 4B). In embodiments, the heights of the plurality of top reference points are used in a least square fit plane method to define the top best fit reference plane, which is an approximation of the set of the heights of the top reference points. It should be understood to those of ordinary skill in the art that the greater the number of the top reference points and the closer the top reference points are localized around the periphery of the first substrate, the better the approximation of the top best fit reference plane covered by the first substrate and/or the C4 connection.

At step 215, measurements of heights of a plurality of bottom reference points are obtained from a bottom surface of the second substrate (see, e.g., 5A). In embodiments, the height of the plurality of bottom reference points may be obtained with the integrated circuit chip assembly flipped upside down. The height of the plurality of bottom reference points should be obtained using the same x and y coordinates used to obtain the height of the plurality of top reference points (e.g., obtain using the same base reference point on an edge of the second substrate) such that the bottom reference points are similarly localized around the periphery of the first substrate.

At step 220, the heights of the plurality of bottom reference points are used to define a bottom best fit reference plane (see, e.g., FIG. 5B). In embodiments, the heights of the plurality of bottom reference points are used in a least square fit plane method to define the bottom best fit reference plane, which is an approximation of the set of the heights of the bottom reference points. It should be understood to those of ordinary skill in the art that the greater the number of the bottom reference points and the closer the bottom reference points are localized around the periphery of the first substrate, the better the approximation of the bottom best fit reference plane covered by the first substrate and/or the C4 connection.

At step 225, measurements of heights of a first set of points are obtained from an external surface of the first substrate (see, e.g., FIG. 6A) with regards to the top best fit reference plane. In embodiments, the external surface may be a top surface of the first substrate. At step 230, measurements of heights of a second set of points are obtained from the bottom surface of the second substrate in an area that corresponds to the position of the first substrate (see, e.g., FIG. 7A) with regards to the bottom best fit reference plane. In embodiments, the height of the second set of points may be obtained with the integrated circuit chip assembly flipped upside down.

At step 235, the top best fit reference plane and the bottom best fit reference plane are adjusted to make them exactly parallel in a same space (e.g., perfectly superimposed) (see, e.g., FIG. 8). In embodiments, the adjustment to the top best fit reference plane and the bottom best fit reference plane may include performing a mathematical transformation (e.g., a three-dimensional affine transformation using a transformation matrix) to transform the top best fit reference plane and the bottom best fit reference plane into exactly parallel planes. The mathematical transformation may include comparing the curved shapes of the top best fit reference plane and the bottom best fit reference plane and adjusting the heights and angles of the top reference points and the bottom reference points prior to defining the adjusted top best fit reference plane and the adjusted bottom best fit reference plane. It should be understood to those of ordinary skill in the art that the greater the number of reference points used in the superposition calculation, a better precision of the mathematical transformation will be obtained.

At step 240, first distances are calculated between each of the heights of the points within the first set of points and the adjusted top best fit reference plane (see, e.g., FIG. 9). At step 245, second distances are calculated between each of the heights of the points within the second set of points and the adjusted bottom best fit reference plane (see, e.g., FIG. 9). It should be understood to those of ordinary skill in the art that the greater the number of points of the first and second set of points, the better the overall estimation of the height of interconnect between the first substrate and the second substrate. The adjusted reference planes are the result of the superposition of the reference points and the mathematical transformation performed in step 235. These mathematical transformations are therefore applied to the first and second set of points in order to place them in the same coordinate system.

At step 250, height values are calculated for the gap or interconnect between the first substrate and the second substrate. In embodiments, the thickness of the first substrate and the second distance may be subtracted from the first distance for each of the corresponding reference points to calculate height values for the gap values for the gap or interconnect between the first substrate and the second substrate. At step 255, the calculated height values may be used to model the gap or interconnect height between the first substrate and the second substrate. In embodiments, the modeling may include plotting each of the calculated height values in a three dimensional graph to visually illustrate the height of the gap or interconnect between the first substrate and the second substrate. In embodiments, the three dimensional graph may be used to quickly inspect the integrated circuit chip assembly for abnormalities, as discussed in detail with respect to FIGS. 13 and 14.

Advantageously, the systems and methods described herein with respect to the present invention provide for a unique approach to defining reference planes in order to apply a differential to calculate the height values of the gap or interconnect between a first substrate and a second substrate. Even more advantageously, in embodiments, the systems and methods of the present invention provide for an estimation of the height values of the gap or interconnect between a first substrate and a second substrate in every coordinate in a short period of time without destroying the integrated circuit chip assembly. Accordingly, the integrated circuit chip assembly may be used in downstream processes, and it is possible to evaluate how the height values of the gap or interconnect impact downstream processes. Furthermore, it is possible to quickly inspect the integrated circuit chip assembly for abnormalities, as discussed in detail with respect to FIGS. 13 and 14.

Figure 12:
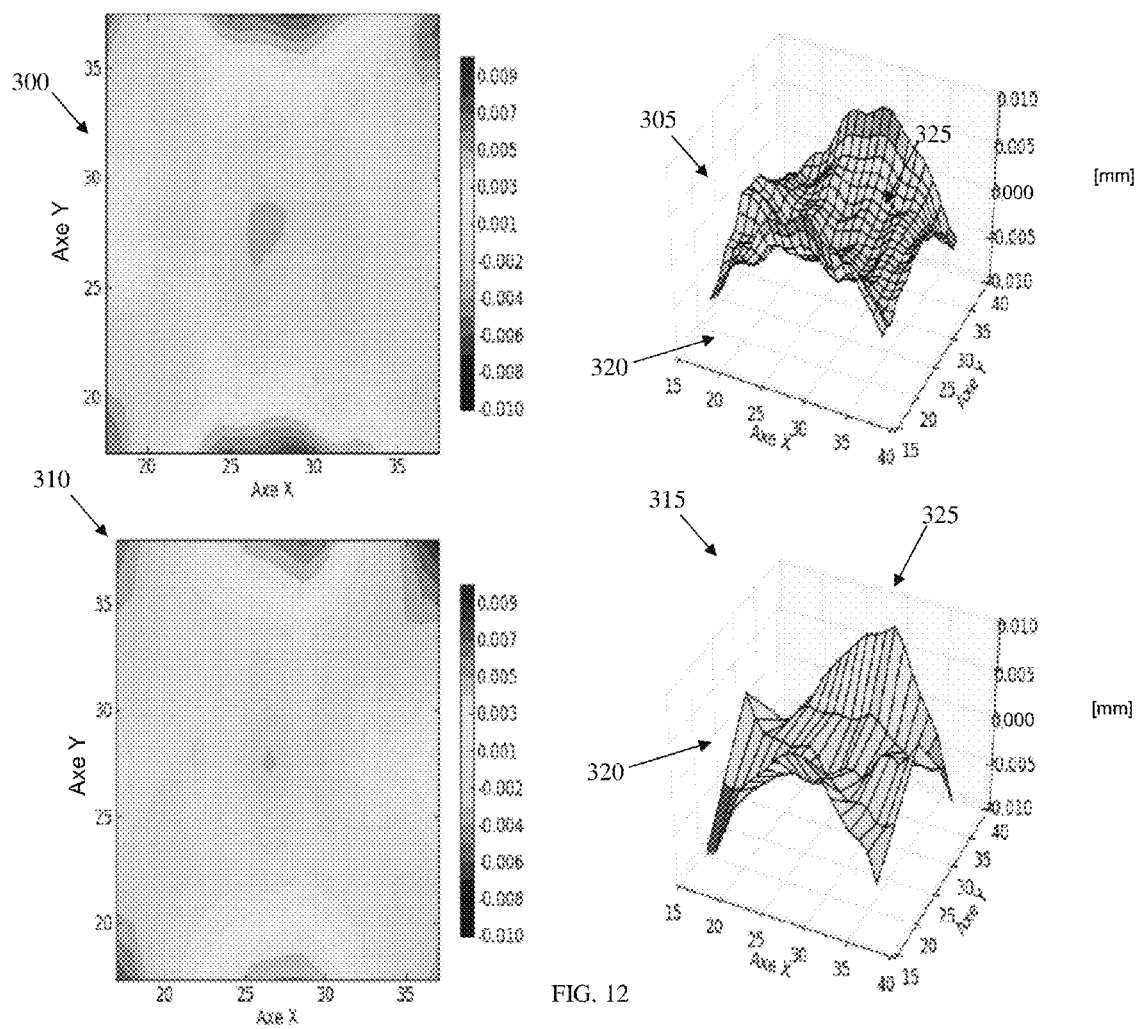
FIG. 12 shows two-dimensional and three-dimensional graphs of height values for a gap or interconnect in accordance with aspects of the invention.

As shown in FIG. 12, the systems and methods described herein with respect to the present invention have been compared to conventional processes for estimating the height values of the gap or interconnect between first and second substrates of an integrated circuit chip assembly. For example, the two dimensional graph 300 and the three dimensional graph 305 illustrate the height of a gap or interconnect between an integrated circuit chip (first substrate) and a carrier (a second substrate) calculated with the processes described above with respect to FIGS. 4A-11. In contrast, the two dimensional graph 310 and the three dimensional graph 315 illustrate the height of a gap or interconnect between a same integrated circuit chip (first substrate) and a same carrier (a second substrate) determined using twenty height values obtained from each of five cross sections of the integrated circuit chip assembly. This comparison validates precision of the systems and methods of the present invention and demonstrates advantageous of the systems and methods of the present invention to provide for measurement of the height values of the gap or interconnect between the first substrate and the second substrate in each coordinate in a short period of time without destroying the integrated circuit chip assembly with one or more cross-sections.

Figure 13:
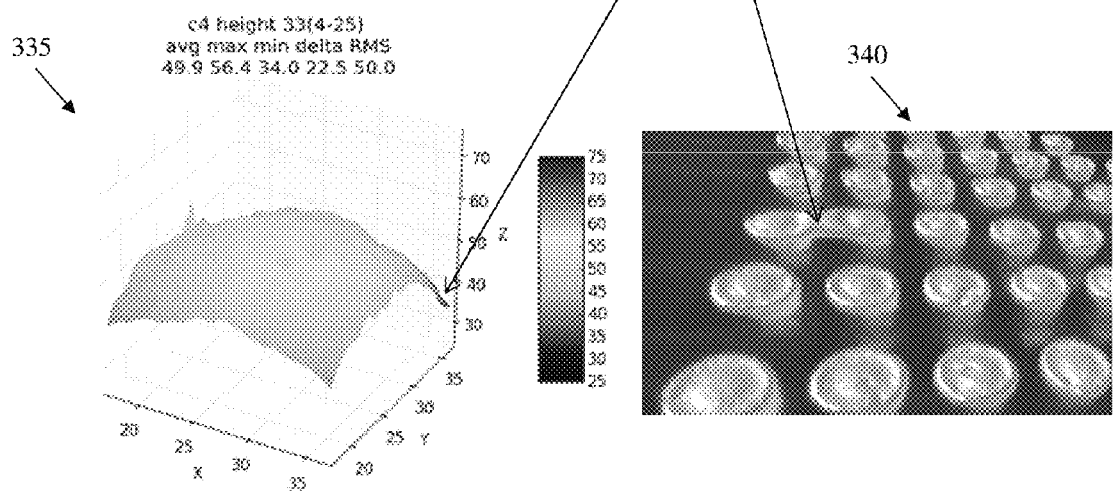
FIG. 13 shows a data table, a three-dimensional graph, and an x-ray image illustrative of an abnormality in a semiconductor device in accordance with aspects of the invention.

FIG. 13 shows an exemplary use of the systems and methods described herein with respect to the present invention to quickly inspect an integrated circuit chip assembly for abnormalities. More specifically, the height values of a gap or interconnect between an integrated circuit chip and a corresponding carrier were calculated with the processes described herein. The C4 height data presented in table 330 and illustrated in three dimensional graph 335 show that a minimum height of 34 µm provides a delta or change of 22.5 µm in height of the gap or interconnect from that of a maximum height of 56 µm that is highly visible and probable of the presence of an abnormality in the gap or interconnect. Three dimensional X-ray tomography images 340 confirmed the presence of an abnormality in the gap or interconnect as a bridge between C4 bumps. Accordingly it should be understood that the systems and methods described herein with respect to the present invention may be used in embodiments to quickly inspect the integrated circuit chip assembly for abnormalities.

FIG. 14 shows a general gap or interconnect abnormality detection process 400 for semiconductor device which can include or not a statistical analysis and comparison with other data source. As shown in FIG. 14, the general gap or interconnect abnormality detection process 400 may comprise multiple stages that occur during the fabrication process and prior to the assembly process being consummated, which are described below. However, it should be noted that this general gap or interconnect abnormality detection process description is for illustration purposes only, and is not meant to limit the present invention. For example, an actual gap or interconnect abnormality detection process may require a designer and/or manufacturer to perform the gap or interconnect abnormality detection process in a different sequence than the sequence described herein.

At step 405, height data for a gap or interconnect may be obtained for at least one semiconductor device comprising a first substrate (e.g., an integrated circuit chip or circuit board) and a second substrate (e.g., a laminate or packaging device). In accordance with aspects of the present invention, the height data is obtained using the systems and processes described herein with respect to FIGS. 4A-11. In embodiments, the height data may be existing height data obtained during fabrication processes of the laminate and the at least one chip. In additional or alternative embodiments, the height data may be obtained dynamically during assembly processes of the at least one semiconductor device.

At step 410, the height data is analyzed for known height data patterns associated with abnormalities in the gap or interconnect. For example, the computing device the computing device 14 as described with respect to FIG. 1) may be configured to compare the maximum and minimum height values for the gap or interconnect to obtain the delta or change between the maximum and minimum height values. The delta or change between the maximum and minimum height values may then be compared to predetermined thresholds, such that any delta or change that exceeds a predetermined threshold is determined as a potential abnormality in the gap or interconnect. In embodiments, the predetermined thresholds are defined from process knowledge and data comparison.

At step 415, the determined potential abnormalities in the gap or interconnect are provided to a user in a report format. For example, the computing device (e.g., the computing device 14 as described with respect to FIG. 1) may be configured to present the height data in table form and/or plotted in a three-dimensional graph with potential abnormalities flagged, as shown in FIG. 12.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of calculating height values of a gap or interconnect between a first substrate and a second substrate of an integrated circuit chip assembly, comprising:
   placing the integrated circuit chip assembly on a staging unit of an inspection system which includes a coordinate measuring system, with a top surface of the second substrate facing away from the staging unit;
   defining a top reference plane from measurement heights obtained by using the coordinate measuring system of a plurality of top reference points on a top surface of the second substrate with the top surface of the second substrate facing away from the staging unit;
   turning over the integrated circuit chip assembly so that the bottom surface of the second substrate faces away from the staging unit;
   defining a bottom reference plane from measurement heights obtained by using the coordinate measuring system of a plurality of bottom reference points on a bottom surface of the second substrate with the bottom surface of the second substrate facing away from the staging unit;
   adjusting data from the top reference plane and data from the bottom reference plane such that the top reference plane and the bottom reference plane are superposed to one another;
   calculating first distances between each measurement height obtained by using the coordinate measuring system of a first set of points on an external surface of the first substrate and the adjusted top reference plane;
   calculating second distances between each measurement height obtained by using the coordinate measuring system of a second set of points on the bottom surface of the second substrate and the adjusted bottom reference plane; and
   calculating the height values of the gap or interconnect between the first substrate and the second substrate by subtracting a thickness of the first substrate and the second distances from the first distances for each set of corresponding points of the first set of points and the second set of points using a computing device.

2. The method of claim 1, wherein:
   the measurement heights of the plurality of top reference points are measured from the top surface of the second substrate in an area that is not covered by the first substrate; and
   the plurality of top reference points are localized around a periphery of the first substrate.

3. The method of claim 2, wherein the defining the top reference plane comprises using the measurement heights of the plurality of top reference points in a least square fit plane method to define the top reference plane.

4. The method of claim 3, wherein the measurement heights of the plurality of bottom reference points are obtained using same x and y coordinates used to obtain the measurement heights of the plurality of top reference points.

5. The method of claim 4, wherein the defining the bottom reference plane comprises using the measurement heights of the plurality of bottom reference points in the least square fit plane method to define the bottom reference plane.

6. The method of claim 5, wherein the adjusting the data from the top reference plane and the data from the bottom reference plane comprises performing a mathematical transformation to transform the top reference plane and the bottom reference plane into parallel planes.

7. The method of claim 6, wherein the external surface of the first substrate is a top surface of the first substrate.

8. The method of claim 7, wherein the measurement heights of the second set of points are obtained using same x and y coordinates used to obtain the measurement heights of the first set of points such that the measurement heights of the second set of points are obtained in an area that corresponds to a position of the first substrate over the second substrate.

9. The method of claim 1, wherein the first substrate is an integrated circuit chip and the second substrate is a laminate of a chip carrier.

10. The method of claim 1, wherein the first substrate is a flip-chip and the second substrate is an electronic substrate.

11. A method of manufacturing an integrated circuit chip assembly which includes a first substrate and a second substrate, comprising:
   obtaining measurement heights of a plurality of top reference points on a top surface of the second substrate using an x, y, z coordinate measuring system at predetermined locations;
   defining a top reference plane from the measurement heights of the plurality of top reference points on the top surface of the second substrate;

obtaining measurement heights of a plurality of bottom reference points on a bottom surface of the second substrate using the x, y, z coordinate measuring system at predetermined locations;

defining a bottom reference plane from the measurement heights of the plurality of bottom reference points on the bottom surface of the second substrate;

adjusting data from the top reference plane and data from the bottom reference plane such that the top reference plane and the bottom reference plane are superposed to one another;

obtaining measurement heights of a first set of points on an external surface of the first substrate using the x, y, z coordinate measuring system in relation to the data from the top reference plane;

calculating first distances between each measurement height of the first set of points on the external surface of the first substrate and the adjusted top reference plane;

obtaining measurement heights of a second set of points on the bottom surface of the second substrate using the x,y, z coordinate measuring system in relation to the data from the bottom reference plane;

calculating second distances between each measurement height of the second set of points on the bottom surface of the second substrate and the adjusted bottom reference plane;

calculating the height values of the gap or interconnect between the first substrate and the second substrate by subtracting a thickness of the first substrate and the second distances from the first distances for each set of corresponding points of the first set of points and the second set of points using a computing device; and modeling heights of the gap or interconnect in a three dimensional graph using the calculated height values and a computing device, wherein the measurement heights of the plurality of top reference points on the top surface of the second substrate are obtained when the top surface of the second substrate faces toward the x, y, z coordinate measuring system, and wherein the measurement heights of the plurality of bottom reference points on the bottom surface of the second substrate are obtained when the bottom surface of the second substrate faces toward the x, y, z coordinate measuring system.

12. The method of claim 11, further comprising analyzing the height values of the gap or interconnect for patterns consistent with abnormalities in the integrated circuit chip assembly.

13. The method of claim 12, further comprising determining a presence of one or more abnormalities in the integrated circuit chip assembly, and reporting the one or more abnormalities to a user.

14. The method of claim 13, wherein the first substrate is an integrated circuit chip and the second substrate is a laminate of a chip carrier.

15. The method of claim 11, wherein:

the measurement heights of the plurality of top reference points are measured from the top surface of the second substrate in an area that is not covered by the first substrate;

the plurality of top reference points are localized around a periphery of the first substrate; and the defining the top reference plane comprises using the measurement heights of the plurality of top reference points in a least square fit plane method to define the top reference plane.

16. The method of claim 15, wherein the measurement heights of the plurality of bottom reference points are obtained using same x and y coordinates used to obtain the measurement heights of the plurality of top reference points.

17. The method of claim 16, wherein the defining the bottom reference plane comprises using the measurement heights of the plurality of bottom reference points in the least square fit plane method to define the bottom reference plane.

18. The method of claim 11, wherein the adjusting the data of the top reference plane and the data of the bottom reference plane comprises performing a mathematical transformation to transform the top reference plane and the bottom reference plane into parallel planes.

19. The method of claim 11, wherein the measurement heights of the second set of points are obtained using same x and y coordinates used to obtain the measurement heights of the first set of points such that the measurement heights of the second set of points are obtained in an area that corresponds to a position of the first substrate over the second substrate.

20. A computer program product for calculating height values of a gap or interconnect between a first substrate and a second substrate of an integrated circuit chip assembly, the computer program product comprising a computer readable storage medium having program instructions embodied therewith, wherein the computer readable storage medium is not a transitory signal per se, and the program instructions are readable by a computing device to cause the computing device to perform a method comprising:

placing the integrated circuit chip assembly including the first substrate and the second substrate on a staging unit of an inspection system which includes a coordinate measuring system;

defining a top reference plane that is an approximation of measurements of heights obtained by using the coordinate measuring system of a plurality of top reference points on a top surface of the second substrate;

defining a bottom reference plane that is an approximation of measurements of heights obtained by using the coordinate measuring system of a plurality of bottom reference points on a bottom surface of the second substrate;

adjusting the top reference plane and the bottom reference plane to be parallel to one another;

calculating first distances between each height measurement obtained by using the coordinate measuring system for a first set of points and the adjusted top reference plane;

calculating second distances between each height measurement obtained by using the coordinate measuring system for a second set of points and the adjusted bottom reference plane; and calculating the height values of the gap or interconnect between the first substrate and the second substrate by subtracting a thickness of the first substrate and the second distances from the first distances for each set of corresponding points of the first set of points and the second set of points, wherein the measurement heights of the plurality of top reference points on the top surface of the second substrate are obtained when the top surface of the second substrate faces toward the coordinate measuring system, and wherein the measurement heights of the plurality of bottom reference points on the bottom surface of the second substrate are obtained when the bottom surface of the second substrate faces toward the coordinate measuring system.

\* \* \* \* \*